(12) United States Patent
Kani et al.

(10) Patent No.: US 11,765,838 B2
(45) Date of Patent: Sep. 19, 2023

(54) RIGHT ANGLE SIDEWALL AND BUTTON INTERCONNECTS FOR MOLDED SIPS

(71) Applicant: Apple Inc., Cupertino, CA (US)

(72) Inventors: Bilal Mohamed Ibrahim Kani, Singapore (SG); Ali N. Ergun, Sunnyvale, CA (US); Kishore N. Renjan, Singapore (SG); Kyusang Kim, Singapore (SG); Manoj Vadeentavida, Singapore (SG); Benjamin J. Grena, San Francisco, CA (US); David M. Kindlon, Felton, CA (US); Lan H. Hoang, Los Gatos, CA (US)

(73) Assignee: Apple Inc., Cupertino, CA (US)

(*) Notice: Subject to any disclaimer, the term of this patent is extended or adjusted under 35 U.S.C. 154(b) by 64 days.

(21) Appl. No.: 17/407,670

(22) Filed: Aug. 20, 2021

(65) Prior Publication Data

US 2023/0055647 A1    Feb. 23, 2023

(51) Int. Cl.
| | |
|---|---|
| *H05K 1/18* | (2006.01) |
| *H05K 3/14* | (2006.01) |
| *H05K 3/18* | (2006.01) |
| *H05K 3/36* | (2006.01) |
| *H05K 3/00* | (2006.01) |
| *H05K 3/34* | (2006.01) |
| *H05K 3/40* | (2006.01) |

(52) U.S. Cl.
CPC ............ *H05K 3/363* (2013.01); *H05K 1/189* (2013.01); *H05K 3/0014* (2013.01); *H05K 3/3436* (2013.01); *H05K 3/4038* (2013.01); *H05K 2201/10151* (2013.01); *H05K 2203/048* (2013.01)

(58) Field of Classification Search
CPC .......... H05K 1/028; H05K 1/18; H05K 1/117; H05K 1/118; H05K 1/144; H05K 1/147; H05K 1/189; H05K 3/0014; H05K 3/18; H05K 3/303; H05K 3/363; H05K 3/3405; H05K 3/3421; H05K 2201/03; H05K 2201/098; H05K 2201/10136; H05K 2201/10151; H05K 2201/041; H05K 2201/049; H05K 2203/048; H05K 2203/107
USPC ........... 361/749; 257/782, E23.023; 438/109
See application file for complete search history.

(56) References Cited

U.S. PATENT DOCUMENTS

| | | |
|---|---|---|
| 6,903,455 B2 | 6/2005 | Sohn |
| 8,659,138 B2 | 2/2014 | Kobayashi et al. |
| 9,475,963 B2 * | 10/2016 | Liang ..................... C09J 7/20 |
| 9,706,092 B1 * | 7/2017 | Tam ...................... H04N 23/55 |
| 9,761,569 B2 | 9/2017 | Yap |
| 10,420,217 B2 * | 9/2019 | Yanagihashi ........ H05K 3/3421 |
| 10,602,612 B1 | 3/2020 | Hoang et al. |
| 10,742,217 B2 | 8/2020 | Dabral et al. |
| 11,031,341 B2 | 6/2021 | Hossain et al. |

(Continued)

*Primary Examiner* — Xiaoliang Chen
(74) *Attorney, Agent, or Firm* — Aikin & Gallant, LLP (57) ABSTRACT

Electronic modules and methods of fabrication are described. In an embodiment, an electronic module includes a molded system-in-package, and a flexible circuit mounted on a side surface of a molding compound layer such that the flexible circuit is in electrical contact with a lateral interconnect exposed along the side surface of the molding compound layer.

16 Claims, 10 Drawing Sheets

(56) References Cited

U.S. PATENT DOCUMENTS

| | | | |
|---|---|---|---|
| 2007/0273045 A1* | 11/2007 | Kitada | H05K 3/363 |
| | | | 438/109 |
| 2018/0204870 A1 | 7/2018 | Momiuchi et al. | |
| 2019/0196546 A1* | 6/2019 | Wu | G01S 7/4813 |
| 2019/0384089 A1* | 12/2019 | Jeon | G02F 1/1339 |
| 2020/0301193 A1* | 9/2020 | Lee | G02F 1/133308 |
| 2020/0333655 A1* | 10/2020 | Jeon | G02F 1/13336 |
| 2020/0335429 A1* | 10/2020 | Okaue | H05K 1/189 |
| 2021/0033909 A1* | 2/2021 | Lee | H05K 3/303 |
| 2021/0055594 A1* | 2/2021 | Zheng | G02F 1/13452 |
| 2021/0066437 A1* | 3/2021 | Ryu | H01L 51/56 |
| 2021/0072582 A1* | 3/2021 | Kim | H01L 51/0096 |
| 2021/0098505 A1* | 4/2021 | Cheng | H01L 27/1218 |
| 2021/0193789 A1* | 6/2021 | Lee | H01L 27/3279 |
| 2021/0200006 A1* | 7/2021 | Ryu | H05K 1/118 |
| 2021/0225746 A1 | 7/2021 | Appelt et al. | |
| 2021/0263370 A1* | 8/2021 | Maeng | G02F 1/13452 |
| 2021/0320142 A1* | 10/2021 | Noguchi | G03B 17/14 |
| 2021/0365157 A1* | 11/2021 | Do | G06F 3/041661 |
| 2022/0057669 A1* | 2/2022 | Fujikawa | H05K 1/144 |

\* cited by examiner

RIGHT ANGLE SIDEWALL AND BUTTON INTERCONNECTS FOR MOLDED SIPS

BACKGROUND

Field

Embodiments described herein relate to electronic modules, and methods of connecting various systems or subsystems.

Background Information

The current market demand for portable and mobile electronic devices such as mobile phones, personal digital assistants (PDAs), digital cameras, portable players, gaming, wearables, and other mobile devices requires the integration of more performance and features into increasingly smaller spaces where available module substrate area may be restricted.

Flexible printed circuit boards (PCB), also referred to as flexible circuits, flex boards, or flexible printed circuits, are becoming more common, where unlike traditional rigid PCBs, the flexible PCBs can be bent, folded or twisted during use or to meet design objectives. Such flex boards commonly include a flexible substrate (e.g. polymer such as polyimide, polyester, polyethylene naphthalate, etc.) with laminated circuit pattern (e.g. metal foil pattern such as copper) on one or both sides of the flexible substrate. In one implementation, electronic modules include various systems or subsystems mounted onto areas of a flexible circuit. For wearable devices in particular, various systems or subsystems, such as sensors, may be secured in a specific location for interaction with the user or environment. This may be accomplished by manipulating the flexible circuit to adjust location of the target system or subsystem.

SUMMARY

Electronic modules and methods of assembly are described. In an embodiment, an electronic module includes a flexible module routing substrate and a plurality of systems mounted on the flexible module routing substrate. A system-in-package (SiP) is also mounted on the flexible module routing substrate. The SiP may include a lateral interconnect encapsulated in a molding compound, and a flexible circuit is mounted on a side surface of the molding compound layer where the lateral interconnect is exposed such that a landing pad of the flexible circuit is in electrical contact with the lateral interconnect. In this manner a right angle sidewall interconnection can be made.

In an embodiment, an electronic module includes a SiP including a routing substrate, and a first electronic component mounted on a first side of the routing substrate and encapsulated in a first molding compound layer. A first lateral interconnect may be bonded to the first side of the routing substrate and also encapsulated in the first molding compound layer. In an embodiment, the first lateral interconnect is exposed along a side surface of the first molding compound layer. A flexible circuit can be mounted on the first side surface of the first molding compound layer such that a first landing pad of the flexible circuit is in electrical contact with the first lateral interconnect exposed along the first side surface of the first molding compound layer.

In another embodiment, an electronic module includes a SiP that includes a routing substrate and a first component mounted on a first side of the routing substrate and encapsulated in a first molding compound layer. A vertical interconnect may be bonded to the first side of the routing substrate and also encapsulated in the first molding compound layer. In an embodiment, a portion of the first vertical interconnect protrudes form a top exterior surface of the first molding compound layer, and an electronic assembly is bonded to the vertical interconnect of the SiP with a solder material. For example, this may be facilitated by placing a reflowable button around the vertical interconnect.

DETAILED DESCRIPTION

Embodiments describe electronic modules and methods of assembly. In an embodiment, an electronic module includes a system-in-package (SiP) and flexible circuit connected with the SiP. The SiP may include a routing substrate, such as a flexible or rigid printed circuit board (PCB), a first electronic mounted on a first side of the routing substrate and encapsulated in a first molding compound layer, and a first lateral interconnected bonded to the first side of the routing substrate and encapsulate din the first molding compound layer, and exposed along a first side surface of the first molding compound layer. In accordance with embodiments, the flexible circuit can be mounted on the first side surface of the first molding compound layer, where a first landing pad of the flexible circuit is in electrical contact with the first lateral interconnect exposed along the first side surface of the first molding compound layer. In this manner, the first lateral interconnect can form a right angle interconnection connection of a flexible circuit to the SiP.

In one aspect, side surface lateral interconnects (such as a right angle interconnect) for SiP may be incorporated due to constrained space on top or bottom sides of a molded SiP. Such configurations thus can leverage previously unused sidewall space for forming SiP to SiP or other peripheral assembly or subassembly interconnections for efficient space utilization. In addition, routing for the SiP routing substrate can be simplified. Furthermore, the SiP top and bottom sides can then be utilized for functions such as electromagnetic interference (EMI) shielding or an antenna in the constrained space available, while the connected peripheral SiP, assembly, or subassembly can be located with less interference that an overlying an EMI shielding or antenna could otherwise potentially cause.

In accordance with embodiments, an electronic module is fabricated using the application of solder button joints onto an exposed vertical interconnect feature, such as a wire bond pillar, copper pillar or pin, solder ball stack, etc., that protrudes from a molding compound. Such a fabrication technique can be leveraged for electronic assemblies including lateral interconnects, as well as for fabricating three-dimensional 3D molded stacks. This may allow for miniaturization without substantial changes at system level as the button joint features can be part of an assembly or subassembly that is mounted onto a another assembly or subassembly that is not redesigned.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "over", "to", "between", and "on" as used herein may refer to a relative position of one layer with respect to other layers. One layer "over", or "on" another layer or bonded "to" or in "contact" with another layer may be directly in contact with the other layer or may have one or more intervening layers. One layer "between" layers may be directly in contact with the layers or may have one or more intervening layers.

Figure 1:
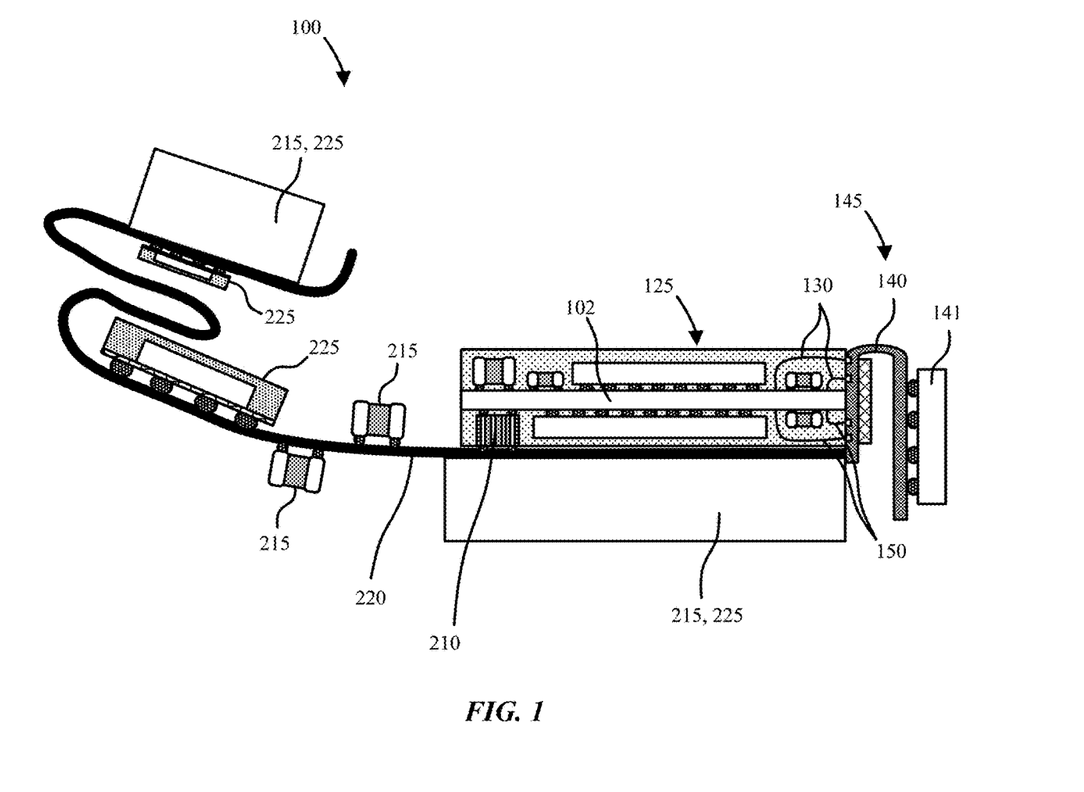
FIG. 1 is a schematic cross sectional side view illustration of an electronic module including a module routing substrate and a plurality of components and systems or subsystems mounted on the module routing substrate in accordance with an embodiment.

Referring now to FIG. 1 a schematic cross sectional side view illustration of an electronic module including a module routing substrate 220 and a plurality of components 215 and systems or subsystems 225 and system-on-packager (SiP) 125 mounted on the module routing substrate 220. In an embodiment, SiP 125 is mounted adjacent an end or edge of the module routing substrate 220. As shown the module routing substrate 220 may be flexible, and bent into a variety of shapes in order to fit into an irregular shaped housing. For example, the module routing substrate 220 may include flexible dielectric layers (e.g. polymer such as polyimide, polyester, polyethylene naphthalate, etc.) with laminated circuit patterns (e.g. metal foil pattern such as copper) on one or both sides of the flexible dielectric layers. Multiple layer module routing substrates 220 can include multiple layers of laminated metal foil layers including metal routing layers, as well as top and bottom side passivation (e.g. polyimide).

In accordance with embodiments, a system or subsystem 145 can be mounted onto a side surface of SiP 125 utilizing a flexible circuit 140 and lateral interconnects 130, 150. The flexible circuit 140 may be formed of similar materials as the module routing substrate 220, though of smaller scale. As shown, the SiP 125 may include electronic components 110, 111, 112 on both sides of a routing substrate 101, and be molded on both sides. The electronic components 110, 111, 112 may be attached using a suitable manner, such as solder bumps 115 (or micro bumps), conductive films, conductive pastes, wirebonding, etc.

Additionally the routing substrate 101 may be electrically connected to the module routing substrate 220 through an interposer 210 including interconnects 212. In accordance with embodiments, an additional system or subsystem 145 can be directly connected to a side surface of the SiP 125 using one or more lateral interconnects 130, 150 and flexible circuit 140. In this manner, routing complexity of the module routing substrate 220 can be reduced. Additionally, total thickness of the module may be reduced.

Figure 2A:
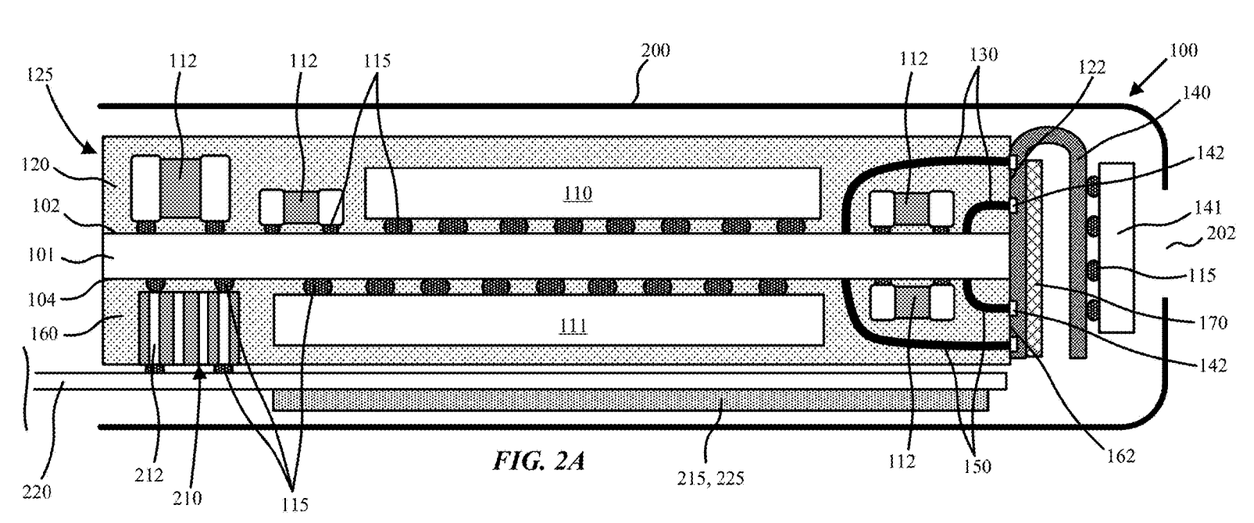
FIG. 2A is a cross-sectional side view illustration of an electronic module including a pin or wirebond wire lateral interconnect in accordance with an embodiment.
Figure 2B:
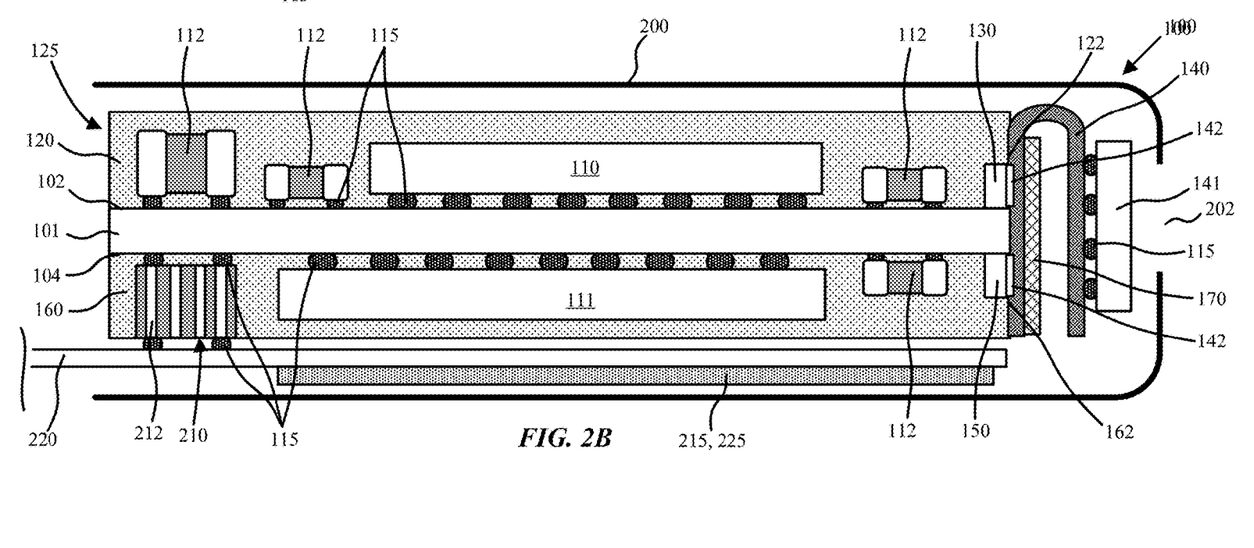
FIG. 2B is a cross-sectional side view illustration of an electronic module including a stud or solder bump stack lateral interconnect in accordance with an embodiment.

Referring now to FIGS. 2A-2B, FIG. 2A is a cross-sectional side view illustration is provided of an electronic module 100 including a pin or wirebond wire lateral interconnect 130, 150 in accordance with an embodiment; FIG. 2B is a cross-sectional side view illustration of an electronic module 100 including a metal stud bump or solder bump stack lateral interconnect 130, 150 in accordance with an embodiment. The lateral interconnects of FIG. 2B may each include a single metal stud bump (e.g. copper stud) or solder bump, or a stack thereof. As shown in each of FIGS. 2A-2B, the electronic module 100 includes a system-in-package (SiP) 125 and flexible circuit 140 mounted on the SiP 125. The flexible circuit 140 can include landing pads 142 (e.g. copper pads) in electrical connection with the lateral interconnects 130, 150. The flexible circuit 140 can additionally be secured in place with a mechanical stiffener 170 on a side opposite the SiP 125. The flexible circuit 140 may be a part of a separate system or subsystem 145, and can include one or more additional integrated electronic components 141. In an embodiment, the integrated electronic component 141 includes a sensor oriented adjacent an opening 202 in a housing 200 within which the electronic module 100 is secured.

In the illustrated embodiment the SiP 125 can include a routing substrate 101, such as a flexible or rigid PCB, a first electronic component 110 mounted on a first side 102 of the routing substrate (e.g. with solder bumps 115, etc.) and encapsulated in a first molding compound layer 120, and a first lateral interconnect 130 bonded to the first side 102 of the routing substrate 101. The first lateral interconnect 130 is also encapsulated in the first molding compound layer 120 and is exposed along a first side surface 122 of the first molding compound layer 120. For example, this maybe accomplished using a singulating/cutting operation or patterning (e.g. etching, drilling, etc.) of the first molding compound layer 120 to expose the first lateral interconnect 130. As shown, a flexible circuit 140 is mounted on the first side surface 122 of the first molding compound layer 120 such that a first landing pad 142 of the flexible circuit 140 is in electrical contact with the first lateral interconnect 130 that is exposed along the first side surface 122 of the first molding compound layer 120.

The routing substrate 101 in accordance with embodiments can be a rigid substrate or flexible substrate. In an embodiment, the routing substrate 101 is a laminate. For example, the routing substrate 101 can be a composite of woven fiberglass cloth and polymer (e.g. resin) and metal routing layers. The routing substrate 101 may be formed of a variety of suitable printed circuit board materials including FR4, prepreg, polyimide, etc. The routing substrate 101 may be rigid or flexible.

The SiP 125 may include components mounted on both sides of the routing substrate 101. A second electronic component 111 can also be mounted on a second side 104 (e.g. opposite the first side 102) of the routing substrate 101 and encapsulated in a second molding compound layer 160. Similarly, a second lateral interconnect 150 can be bonded to the second side 104 of the routing substrate 101, encapsulated in the second molding compound layer 160, and exposed along a second side surface 162 of the second molding compound layer 160. The second side surface 162, and first side surface 122 may be co-planar, and created with the same singulating or cutting operation. The flexible circuit 140 may also be mounted on the second side surface 162 of the second molding compound layer 160, with a second landing pad 142 of the flexible circuit 140 in electrical contact with the second lateral interconnect 150 exposed along the second side surface 162 of the second molding compound layer 160.

It is to be appreciated that while only a single first electronic component 110 is illustrated as being mounted on the first side 102 of the routing substrate 101, a plurality of first electronic components 110 can be mounted. Similarly, a plurality of second electronic components 111 can be mounted on the second side 104 of the routing substrate 101. Both possibilities are illustrated generally with additional electronic components 112 in FIG. 2A mounted on both sides of the routing substrate 101. The electronic components in accordance with embodiments can be dies ranging from system-on-chip (SOC) to memory, passive components (resistors, capacitors, inductors, etc.), micro-electromechanical systems (MEMS), sensors, etc. A variety of configurations of different electronic components is understood.

Figure 3A:
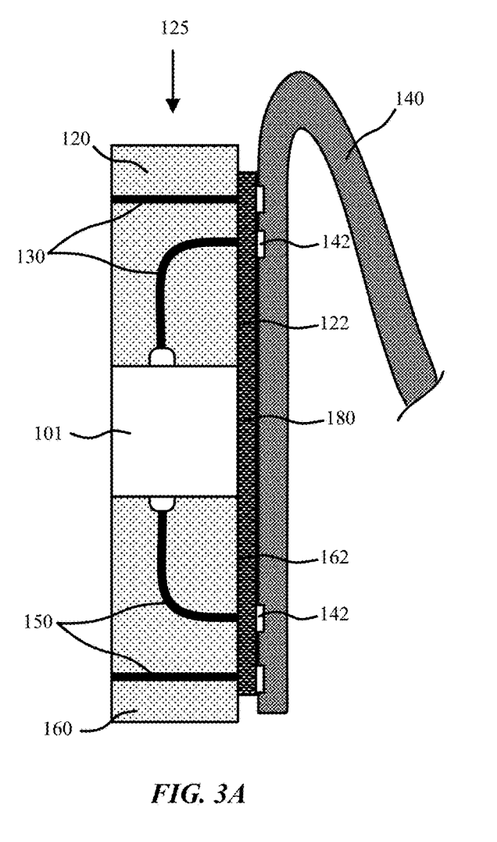
FIG. 3A is a close-up cross-sectional side view illustration of an electronic module including a flexible circuit bonded to an SiP with a continuous bonding layer film in accordance with an embodiment.
Figure 3B:
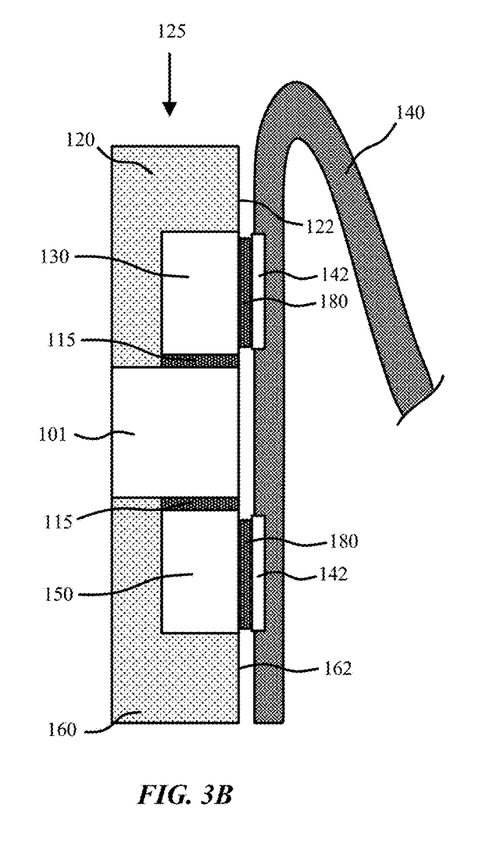
FIG. 3B is a close-up cross-sectional side view illustration of an electronic module including a flexible circuit bonded to an SiP with a plurality of separate bonding layer films in accordance with an embodiment.

The flexible circuits 140 in accordance with embodiments can be attached to the SiP 125 using a suitable material to provide adhesion and electrical connection with landing pads 142. FIG. 3A is a close-up cross-sectional side view illustration of an electronic module including a flexible circuit 140 bonded to an SiP 125 with a continuous bonding layer film 180 in accordance with an embodiment. FIG. 3B is a close-up cross-sectional side view illustration of an electronic module including a flexible circuit 140 bonded to an SiP 125 with a plurality of separate bonding layer films 180 in accordance with an embodiment. For example, a separate bonding layer film may applied for each landing pad 142. It is to be appreciated that while separate bonding layer films 180 are illustrated for different lateral interconnects 130, 150 in FIGS. 3A-3B, this is applicable for either configuration, which can be partly dependent on surface area of the exposed lateral interconnects 130, 150 and bonding alignment capabilities. It may additionally be possible to form wider lateral interconnects 130, 150 with U-shaped copper pins than wirebond wires, for example, with better alignment. For example, a wirebond wire in accordance with an embodiment can have a maximum width of 25-75 µm where exposed along the first side surface of the first molding compound layer. In an embodiment, a copper pin can have a maximum width of 250-500 µm where exposed along the first side surface of the first molding compound layer. Larger areas can be provided with metal stud bumps, solder bumps, etc.

Figure 4A:
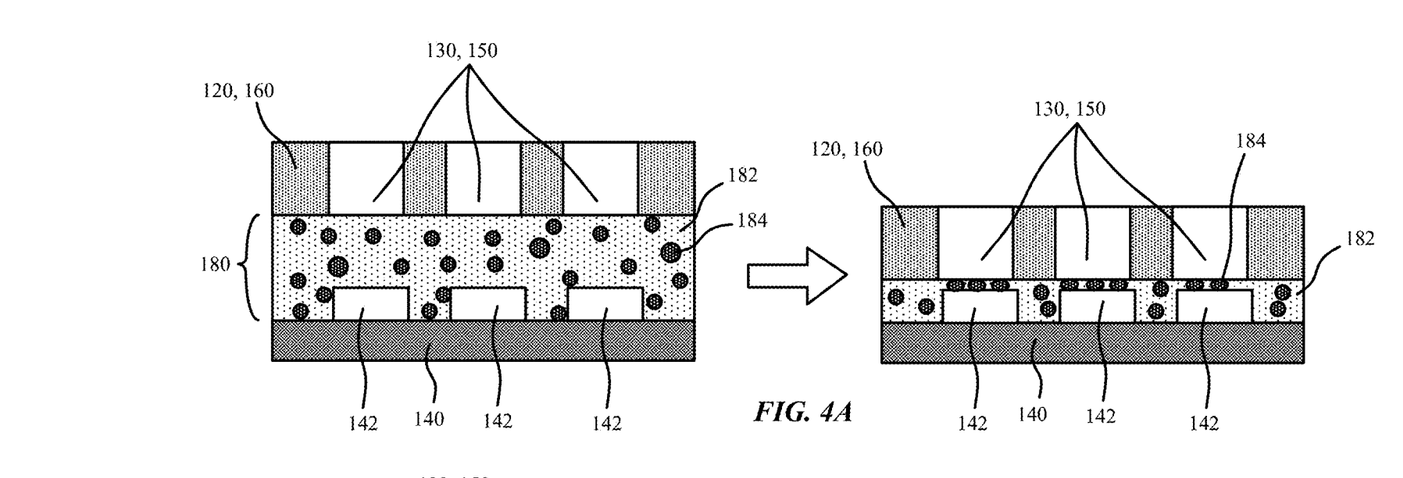
FIG. 4A is a close-up cross-sectional side view illustration for bonding a flexible circuit to SiP with an anisotropic conductive film in accordance with an embodiment.

FIG. 4A is a close-up cross-sectional side view illustration for bonding a flexible circuit 140 to SiP 125 with an anisotropic conductive film in accordance with an embodiment. As shown, an anisotropic film (bonding layer film) can include an adhesive matrix 182 such as epoxy, and a conductive filler such as metal particles 184. Upon application of heat and pressure, particles sandwiched between the landing pads 142 and lateral interconnects 130, 150 provide an electrically conductive path, and the adhesive matrix is cured.

Figure 4B:
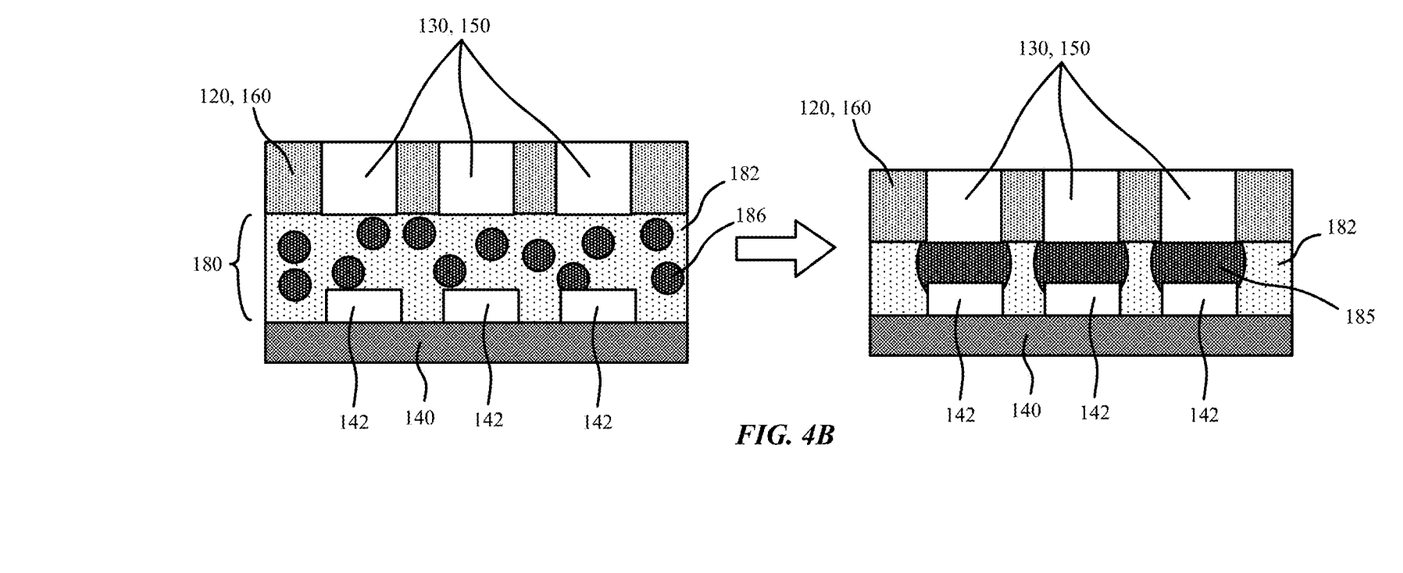
FIG. 4B is a close-up cross-sectional side view illustration for bonding a flexible circuit to SiP with a self-alignment paste in accordance with an embodiment.

FIG. 4B is a close-up cross-sectional side view illustration for bonding a flexible circuit 140 to SiP 125 with a self-alignment paste in accordance with an embodiment. As shown, a self-alignment paste (bonding layer film) can include an adhesive matrix 182 such as epoxy, and a conductive filler such as solder particles 186. Upon application of heat the solder particles coalesce and form solder joints 185 between the landing pads 142 and lateral interconnects 130, 150 provide an electrically conductive path, and the adhesive matrix is cured.

Figure 5:
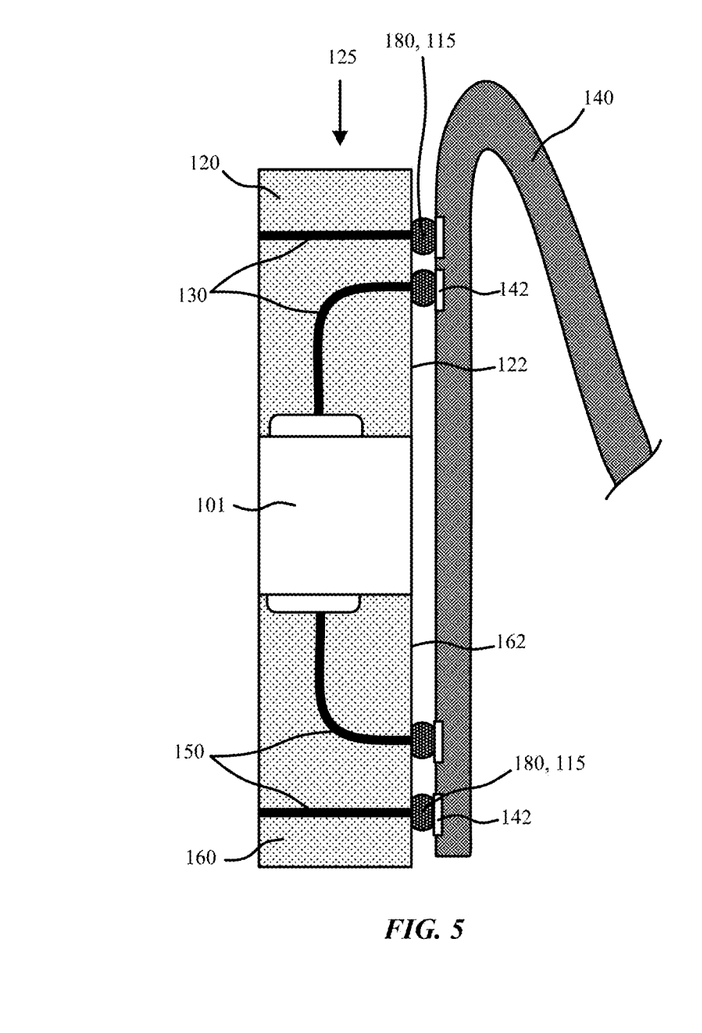
FIG. 5 is a close-up cross-sectional side view illustration of an electronic module including a flexible circuit bonded to an SiP with a plurality of separate solder bumps in accordance with an embodiment.

Referring now to FIG. 5, a close-up cross-sectional side view illustration is provided of an electronic module including a flexible circuit 140 bonded to an SiP 125 with a plurality of separate solder bumps 115 (bonding layer films) in accordance with an embodiment.

Figure 6:
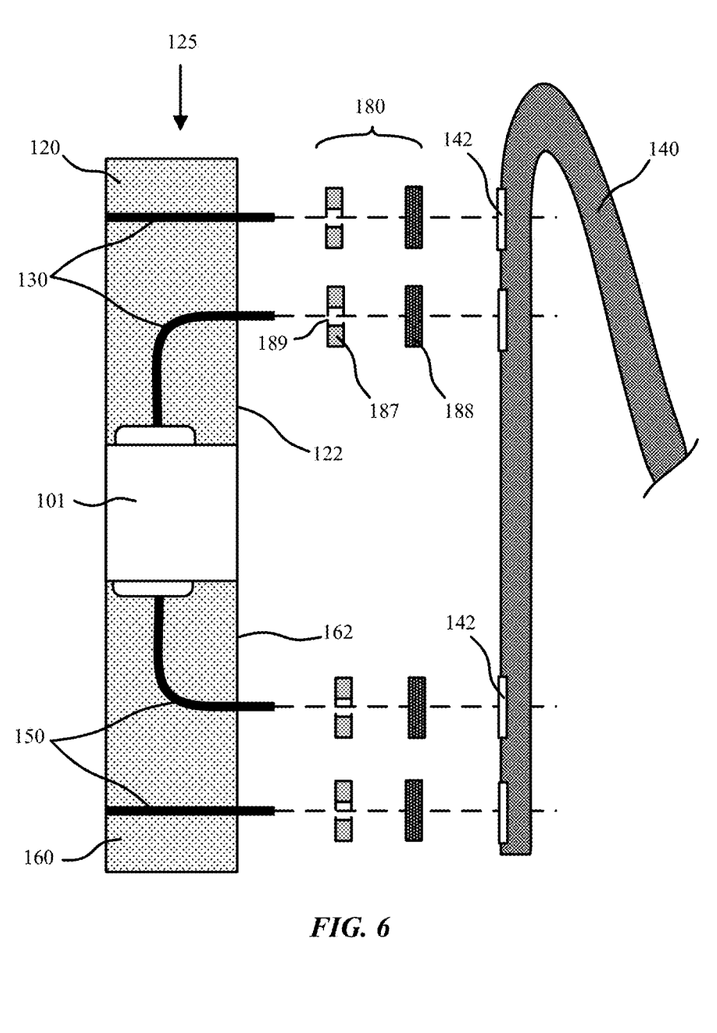
FIG. 6 is a close-up cross-sectional side view illustration of an electronic module including a flexible circuit bonded to an SiP with a plurality of separate button joints in accordance with an embodiment.

FIG. 6 is a close-up cross-sectional side view illustration of an electronic module including a flexible circuit 140 bonded to an SiP 125 with a plurality of separate button joints in accordance with an embodiment. In the illustrated embodiment, the lateral interconnects 130, 150 may protrude from the side surfaces 122, 162 of the molding compound layers 120, 160. A solder material (bonding layer film 180) bonds the lateral interconnects to the flexible circuit 140. As shown, this can be accomplished by first placing buttons 187 around the protruding lateral interconnects, and optional top solder paste 188. In an embodiment the buttons include a center hole that fits around the protruding lateral interconnect. For example, the buttons may be ring shaped. The buttons 187 may be formed of a reflowable solder material. Upon applying heat and pressure the buttons 187 and solder paste 188 can reflow to create a solder joint.

Figure 7:
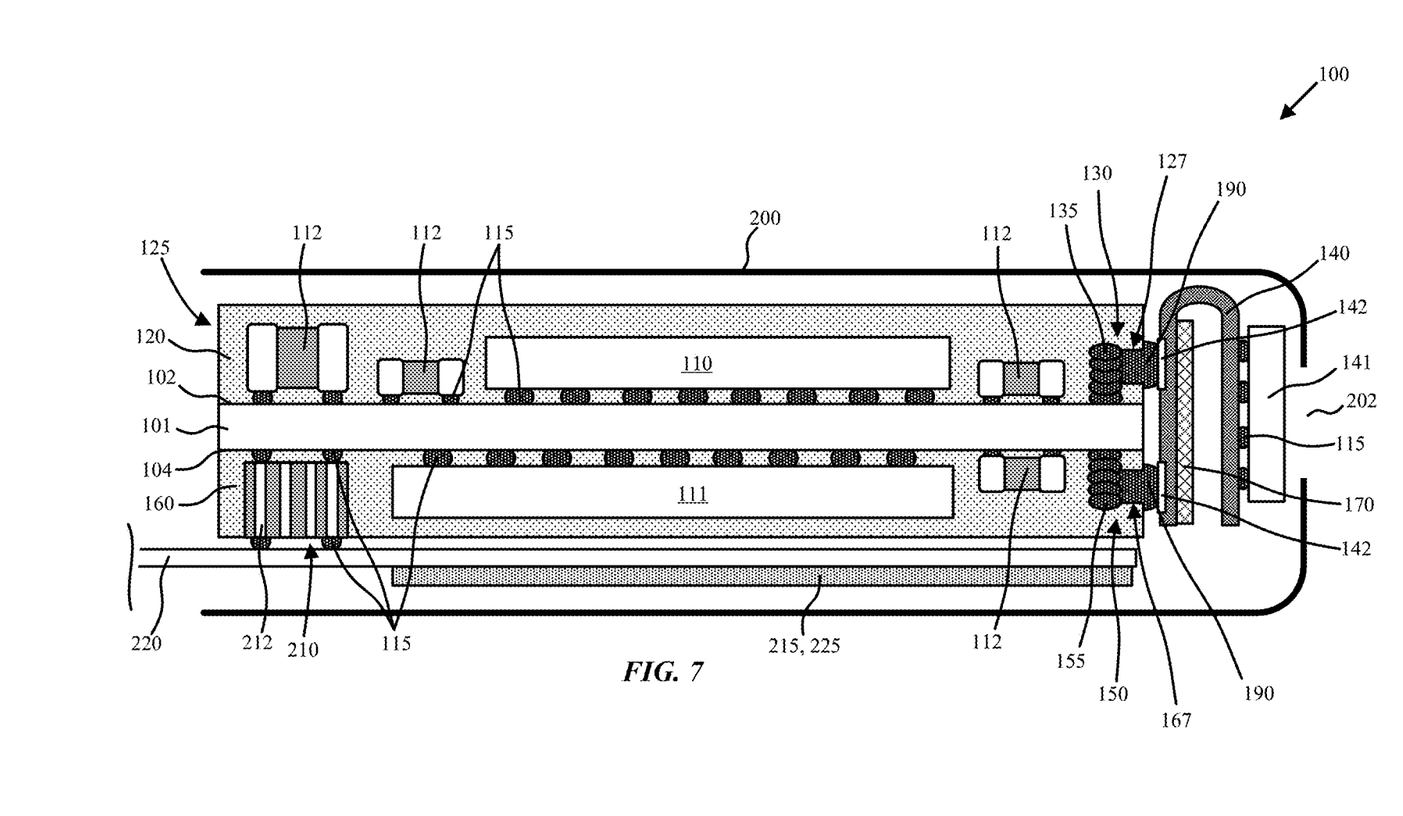
FIG. 7 is a close-up cross-sectional side view illustration of an electronic module including a flexible circuit bonded to an SiP through a side via in accordance with an embodiment.

Referring now to FIG. 7 is a close-up cross-sectional side view illustration is provided for an electronic module including a flexible circuit 140 bonded to an SiP 125 through a side via 127, 167 formed in the molding compound layer 120,160 in accordance with an embodiment. As shown the lateral interconnects 130, 150 can include a vertical interconnect of one or more solder bumps 135, 155 metal stud bumps, wire, etc. and a side solder bump 190 or other conductive filler within side vias 127, 167. As shown, side vias 127, 167 are formed in the side surfaces 122, 162 of the molding compound layers 120, 160 and a solder bumps 190 can be used to bond the flexible circuit 140. The solder bumps 190 may at least partially, or fully, fill the side vias 127, 167 after reflow.

Figure 8A:
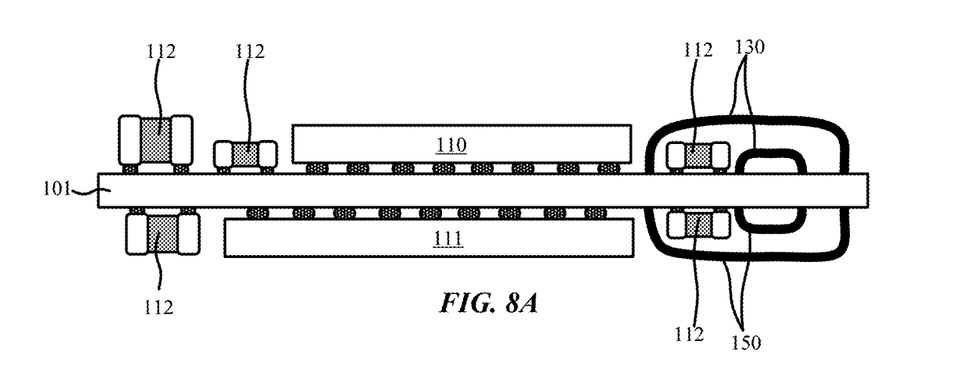
FIGS. 8A-8C are cross-sectional side view illustrations of method of forming an electronic module including a pin or wirebond wire lateral interconnect in accordance with an embodiment.
Figure 8B:
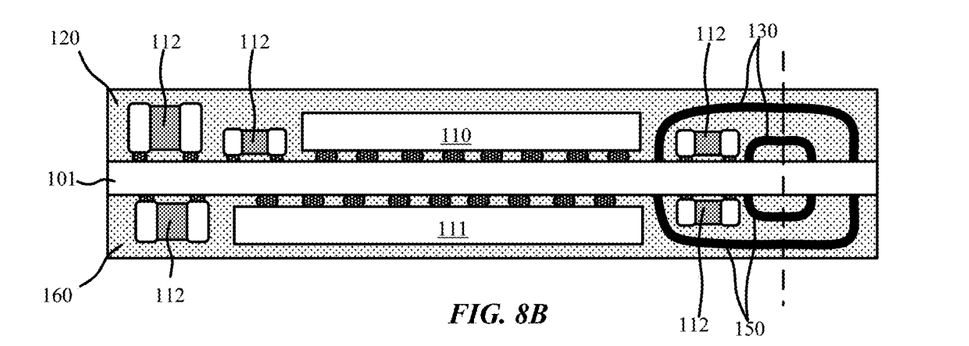
Figure 8C:
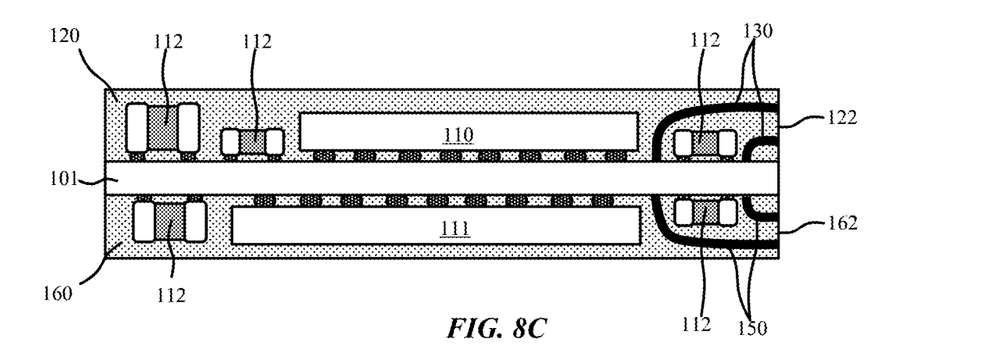

FIGS. 8A-8C are cross-sectional side view illustrations of method of forming an electronic module including a pin or wirebond wire lateral interconnect in accordance with an embodiment. Specifically, the process flow of FIGS. 8A-8C can be used to fabricate the electronic module of FIG. 2A. Initially the one or more electronic components 110, 111 and additional electronic components 112 are surface mounted on the routing substrate 101 as shown in FIG. 8A. Additionally, the lateral interconnects 130, 150 can be added. For example, copper pins can be surface mounted in a U-shape loop structure. Similarly wire bond wire loops can be bonded in a U-shape loop structure.

One or both sides of the routing substrate 101 can then be overmolded (encapsulated) with molding compound layers 120, 160 as shown in FIG. 8B. The U-shape loop structures, molding compound layer, and routing substrate can then be cut (e.g. singulation process) to expose a portion of the lateral interconnects along the side surfaces of the molding compound layers, resulting in the structure illustrated in FIG. 8C. The extension section which has been singulated may be a part of another SiP, or a dummy feature. A flexible circuit 140 can then be bonded to the singulated side surfaces 122, 162 of the molding compound layers 120, 160 with exposed lateral interconnects 130, 150 using a suitable bonding layer film such as previously described with regard to FIGS. 3A-5.

In an alternative process flow, the molding operation does not entirely cover the U-shaped loop structures. Thus, after molding, and singulation the lateral interconnects 130, 150 may extend from the side surfaces 122, 162 of the molding compound layers. Button joints may then be used for bonding with the flexible circuit 140 as described with regard to FIG. 6.

Figure 9A:
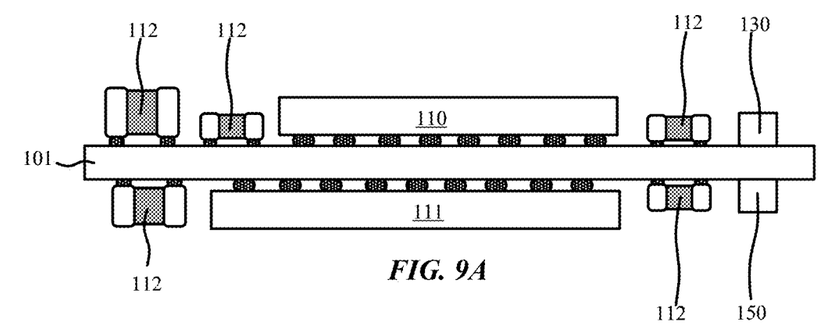
FIGS. 9A-9C are cross-sectional side view illustrations of method of forming an electronic module including a stud or solder bump stack lateral interconnect in accordance with an embodiment.
Figure 9B:
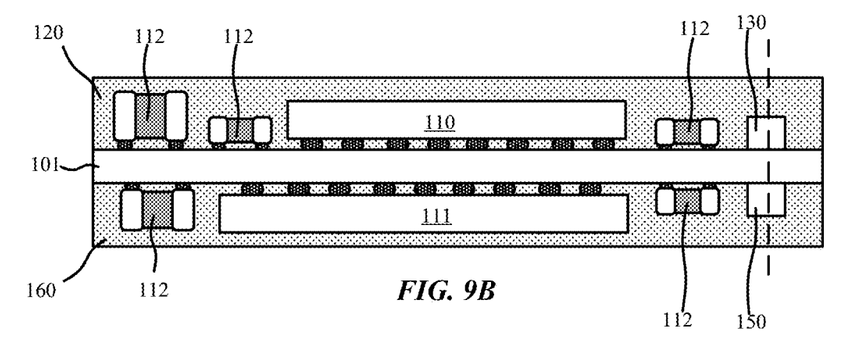
Figure 9C:
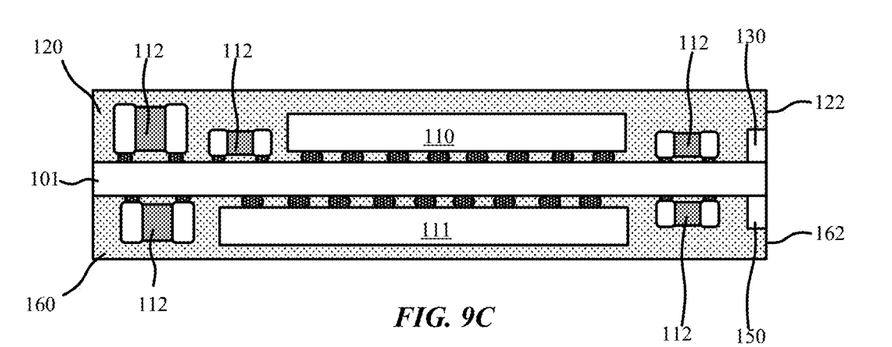

FIGS. 9A-9C are cross-sectional side view illustrations of method of forming an electronic module including a stud or solder bump stack lateral interconnect in accordance with an embodiment. Specifically, the process flow of FIGS. 9A-9C can be used to fabricate the electronic module of FIG. 2B. Initially the one or more electronic components 110, 111 and additional electronic components 112 are surface mounted on the routing substrate 101 as shown in FIG. 8A. Additionally, the lateral interconnects 130, 150 can be added. For example, lateral metal stud bumps or solder bumps can be added. Metal stud bumps can be mounted using a solder or conductive material. Additionally, stacks of metal stud bumps or solder bumps can be added.

One or both sides of the routing substrate 101 can then be overmolded with molding compound layers 120, 160 as shown in FIG. 9B. The lateral interconnects 130, 150 can then be singulated, for example, in a wafer sawing operation, resulting in the structure illustrated in FIG. 9C. The extension section which has been singulated may be a part of another SiP, or a dummy feature. A flexible circuit 140 can then be bonded to the singulated side surfaces 122, 162 of the molding compound layers 120, 160 with exposed lateral interconnects 130, 150 using a suitable bonding layer film such as previously described with regard to FIGS. 3A-5.

Figure 10A:
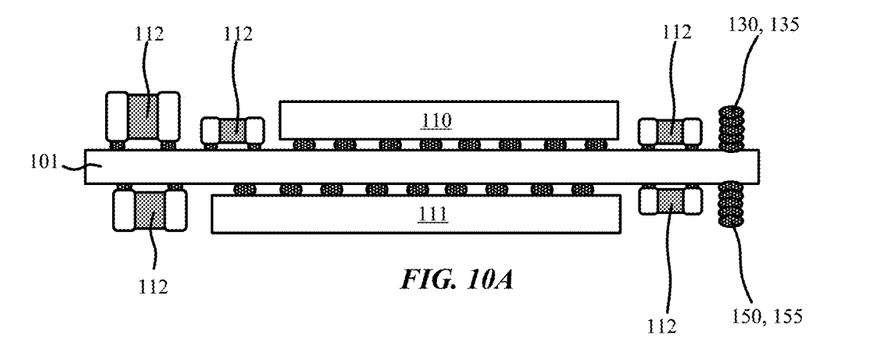
FIGS. 10A-10C are cross-sectional side view illustrations of method of forming an electronic module including a flexible circuit bonded to an SiP through a side via in accordance with an embodiment.
Figure 10B:
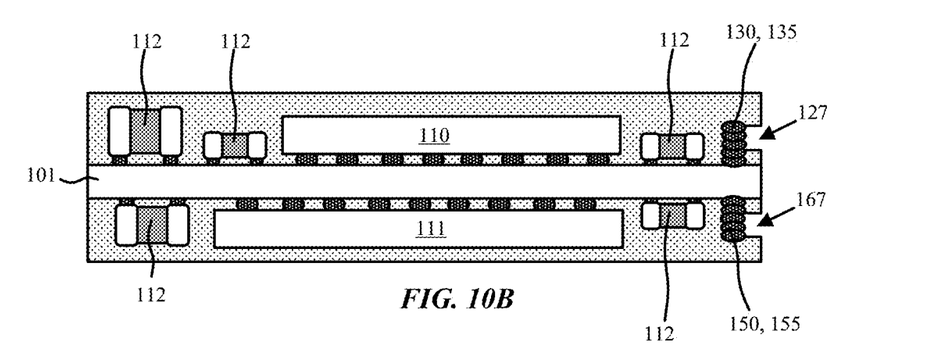
Figure 10C:
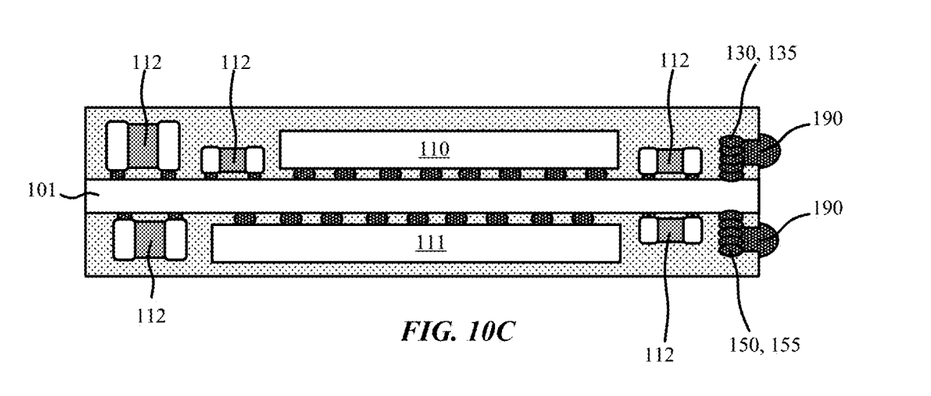

FIGS. 10A-10C are cross-sectional side view illustrations of method of forming an electronic module including a flexible circuit bonded to an SiP through a side via in accordance with an embodiment. Specifically, the process flow of FIGS. 10A-10C can be used to fabricate the electronic module of FIG. 7. Initially the one or more electronic components 110, 111 and additional electronic components 112 are surface mounted on the routing substrate 101 as shown in FIG. 10A. Additionally, the lateral interconnects 130, 150 can be added. For example, lateral metal stud bumps or solder bumps can be added similarly as described with regard to FIG. 9A. Metal stud bumps can be mounted using a solder or conductive material. Additionally, stacks of metal stud bumps or solder bumps can be added.

One or both sides of the routing substrate 101 can then be overmolded with molding compound layers 120, 160 as shown in FIG. 10B. With the stacks of metal stud bumps or solder bumps encapsulated inside the molding compound layers. Side vias 127, 167 are then formed in the side surfaces 122, 162 of the molding compound layers 120, 160 to expose the stacks of metal stud bumps or solder bumps. As shown in FIG. 9C, solder bumps 190 can be added to the side vias 127, 167. A flexible circuit 140 can then be bonded directly to the solder bumps 190.

Figure 11A:
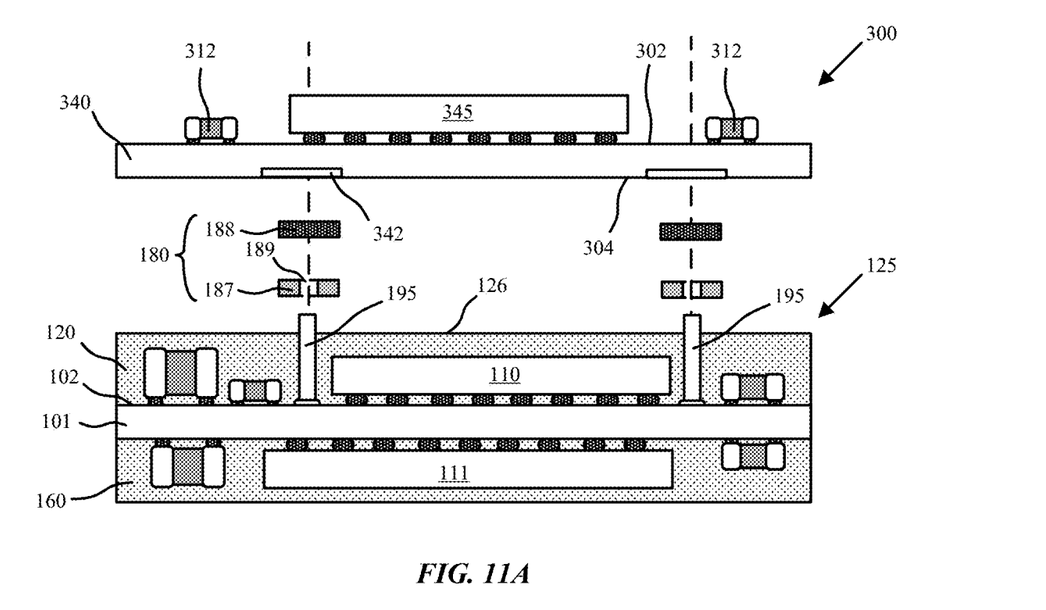
FIGS. 11A-11B are cross-sectional side view illustrations of method of forming an electronic module including a 3D molded stack and button joints in accordance with an embodiment.
Figure 11B:
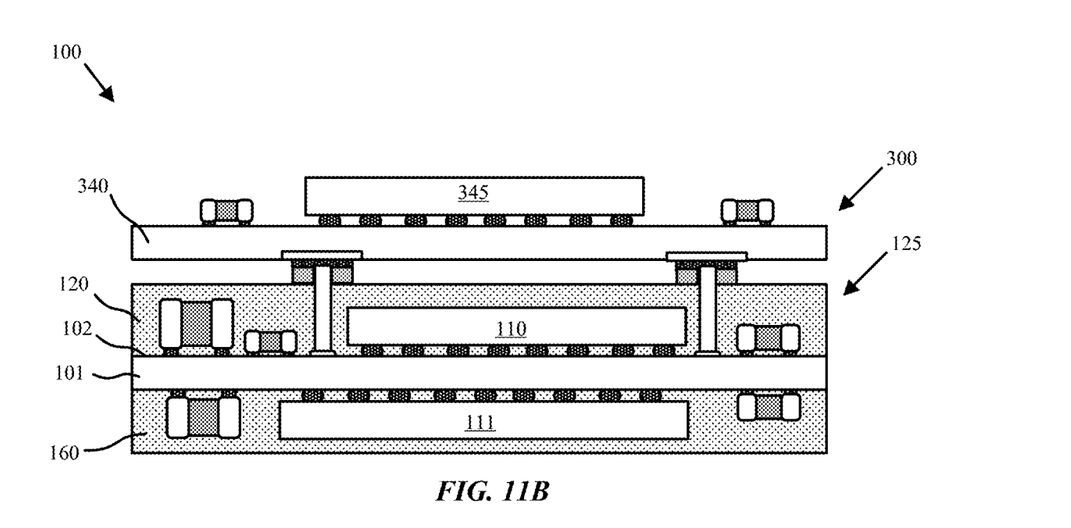

Referring now to FIGS. 11A-11B cross-sectional side view illustrations are provided for a method of forming an electronic module 100 including a 3D molded stack and button joints in accordance with an embodiment. The assembly process is similar to that illustrated and described with regard to FIG. 6, with a difference being that button joints are used to form vertical 3D stacked structures. As shown, the electronic module 100 includes an SiP 125 similar to those previously described herein. For example, the SiP 125 includes a routing substrate 101, a first electronic component 110 mounted on a first side 102 of the routing substrate and encapsulated in a first molding compound layer 120. The primary structural difference for the SiP 125 in FIGS. 11A-11B is the inclusion of one or more vertical interconnects 195 bonded to the first side 102 of the routing substrate 101 (e.g. with solder) and encapsulated in the first molding compound layer 120. Furthermore, a portion of the vertical interconnect 195 protrudes from a top exterior surface 126 of the first molding compound layer 120. As shown an electronic assembly 300 can then be bonded to the vertical interconnect(s) 195 of the SiP 125 with a solder material.

In an embodiment, the electronic assembly 300 includes a circuit board 340 and a second electronic component 345 mounted on a first side 302 of the circuit board. Additional electronic components 312 may also be mounted on the first side 302 of the circuit board. A second side 304 of the circuit board 340 including landing pads 342 is bonded to the vertical interconnect(s) 195. Similar to the description of FIG. 6, buttons 187 can be placed over the exposed vertical interconnects 195, followed by optional dispensing of a solder paste 188. Upon applying heat and pressure the buttons 187 and solder paste 188 can reflow to create a solder joint.

Such a configuration may allow for miniaturization without substantial changes at the system level. Furthermore the solderable buttons 187 can allow for fine pitch interconnection between molded assembly, with fine pitch of less than 300 μm.

In utilizing the various aspects of the embodiments, it would become apparent to one skilled in the art that combinations or variations of the above embodiments are possible for forming an electronic module. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. An electronic module comprising:
   a system-in-package including:
      a routing substrate;
      a first electronic component mounted on a first side of the routing substrate and encapsulated in a first molding compound layer;
      a first lateral interconnect bonded to the first side of the routing substrate, wherein the first lateral interconnect extends through and is encapsulated in the first molding compound layer, and is exposed along a first side surface of the first molding compound layer; and
   a flexible circuit mounted on the first side surface of the first molding compound layer, wherein a first landing pad of the flexible circuit is in electrical contact with the first lateral interconnect exposed along the first side surface of the first molding compound layer.

2. The electronic module of claim 1, wherein the system-in-package further includes:
   a second electronic component mounted on a second side of the routing substrate and encapsulated in a second molding compound layer; and
   a second lateral interconnect bonded to the second side of the routing substrate, encapsulated in the second molding compound layer, and exposed along a second side surface of the second molding compound layer.

3. The electronic module of claim 2, wherein the flexible circuit is mounted on the second side surface of the second molding compound layer, wherein a second landing pad of the flexible circuit is in electrical contact with the second lateral interconnect exposed along the second side surface of the second molding compound layer.

4. The electronic module of claim 1, wherein the first lateral interconnect comprises a metal pin or wirebond wire.

5. The electronic module of claim 4, wherein the first lateral interconnect has a maximum width of 25-75 μm where exposed along the first side surface of the first molding compound layer.

6. The electronic module of claim 4, wherein the first lateral interconnect has a maximum width of 250-500 μm where exposed along the first side surface of the first molding compound layer.

7. The electronic module of claim 1, wherein the first lateral interconnect comprises a metal stud bump.

8. The electronic module of claim 1, wherein the first lateral interconnect comprises a solder bump.

9. The electronic module of claim 1, wherein the flexible circuit is mounted on the first side surface of the first molding compound layer with a cured anisotropic conductive film.

10. The electronic module of claim 1, wherein the flexible circuit is mounted on the first side surface of the first molding compound layer with a cured self-alignment paste.

11. The electronic module of claim 1, wherein the flexible circuit is mounted on the first side surface of the first molding compound layer with a solder bump.

12. The electronic module of claim 1, wherein the first lateral interconnect protrudes from first side surface of the first molding compound layer.

13. The electronic module of claim 12, further comprising a solder material bonding the first lateral interconnect to the flexible circuit.

14. The electronic module of claim 1, further comprising an integrated electronic component mounted on the flexible circuit, wherein the integrated electronic component is electrically connected with the routing substrate.

15. The electronic module of claim 14, wherein the integrated electronic component comprises a sensor.

16. The electronic module of claim 15, wherein the system-in-package and the flexible circuit are secured in a housing, and the sensor is oriented adjacent an opening in the housing.

* * * * *